United States Patent
Kiel

(10) Patent No.: US 10,804,183 B2
(45) Date of Patent: Oct. 13, 2020

(54) METHOD FOR THE INTEGRATION OF POWER CHIPS AND BUS-BARS FORMING HEAT SINKS

(71) Applicant: INSTITUT VEDECOM, Versailles (FR)

(72) Inventor: Friedbald Kiel, Fontainebleau (FR)

(73) Assignee: INSTITUT VEDECOM, Versailles (FR)

( * ) Notice: Subject to any disclaimer, the term of this patent is extended or adjusted under 35 U.S.C. 154(b) by 153 days.

(21) Appl. No.: 16/470,516

(22) PCT Filed: Dec. 6, 2017

(86) PCT No.: PCT/FR2017/053408
§ 371 (c)(1),
(2) Date: Jun. 17, 2019

(87) PCT Pub. No.: WO2018/115625
PCT Pub. Date: Jun. 28, 2018

(65) Prior Publication Data
US 2019/0311972 A1 Oct. 10, 2019

(30) Foreign Application Priority Data
Dec. 19, 2016 (FR) ...................................... 16 62804

(51) Int. Cl.
*H01L 23/473* (2006.01)
*H01L 23/373* (2006.01)
(Continued)

(52) U.S. Cl.
CPC .......... *H01L 23/473* (2013.01); *H01L 23/373* (2013.01); *H01L 23/49838* (2013.01);
(Continued)

(58) Field of Classification Search
CPC ................ H01L 23/473; H01L 23/373; H01L 23/49838; H01L 23/5389; H01L 25/18; H01L 24/25
See application file for complete search history.

(56) References Cited

U.S. PATENT DOCUMENTS

2009/0115047 A1* 5/2009 Haba .................... H01L 21/4857
257/690
2010/0002406 A1* 1/2010 Hsu .................... H01L 23/49822
361/764

(Continued)

OTHER PUBLICATIONS

International Search Report for PCT/FR2017/053408 dated Jun. 19, 2018.
Written Opinion for PCT/FR2017/053408 dated Jun. 19, 2018.

*Primary Examiner* — Nathan W Ha
(74) *Attorney, Agent, or Firm* — Sandberg Phoenix & von Gontard, P.C.

(57) ABSTRACT

The method for producing a preform integrating at least one electronic chip included between insulating and/or conductive laminated internal layers; mechanically securing metal bus-bar segments at given spaced-apart positions on opposing upper and lower faces of the preform, using dielectric portions of a resin prepreg; and for each of the upper and lower opposing faces, electrodepositing a metal layer in order to interconnect bus-bar segments secured to the face in question and an electrode of the electronic chip, thereby forming an electronic power circuit comprising bus-bars forming heat sinks.

10 Claims, 7 Drawing Sheets

(51) Int. Cl.
*H01L 23/498* (2006.01)
*H01L 23/538* (2006.01)
*H01L 25/18* (2006.01)
*H01L 23/00* (2006.01)

(52) U.S. Cl.
CPC .......... *H01L 23/5389* (2013.01); *H01L 25/18* (2013.01); *H01L 24/25* (2013.01); *H01L 24/82* (2013.01); *H01L 2224/2518* (2013.01)

(56) References Cited

U.S. PATENT DOCUMENTS

| | | | | |
|---|---|---|---|---|
| 2012/0068359 A1* | 3/2012 | Mori | ................. | H01L 23/49827 257/774 |
| 2013/0020572 A1* | 1/2013 | He | ................... | H01L 23/49827 257/48 |
| 2013/0020694 A1* | 1/2013 | Liang | .................. | H01L 25/072 257/691 |
| 2013/0037950 A1* | 2/2013 | Yu | ..................... | H01L 23/49816 257/738 |
| 2015/0085446 A1* | 3/2015 | Hable | ..................... | H01L 23/31 361/719 |
| 2015/0200185 A1* | 7/2015 | Yu | ........................ | H01L 24/17 257/737 |
| 2015/0214127 A1* | 7/2015 | Gu | ....................... | H01L 23/367 257/712 |
| 2015/0334842 A1* | 11/2015 | Shimabe | ........... | H01L 23/49822 174/258 |
| 2016/0086930 A1* | 3/2016 | Koey | .................... | H01L 21/486 257/773 |
| 2016/0095201 A1* | 3/2016 | Min | ...................... | H05K 1/0204 361/709 |
| 2016/0095203 A1* | 3/2016 | Min | ...................... | H05K 1/0207 361/690 |
| 2016/0104668 A1* | 4/2016 | Lii | ......................... | H01L 25/50 257/774 |
| 2016/0133558 A1 | 5/2016 | Stahr et al. | | |
| 2016/0260695 A1* | 9/2016 | Chung | ................ | H01L 25/105 |
| 2016/0290728 A1* | 10/2016 | Coteus | ................. | H01L 23/473 |
| 2016/0300779 A1* | 10/2016 | Watanabe | ............... | H01L 24/19 |
| 2016/0322294 A1* | 11/2016 | Kobayashi | ........ | H01L 23/49822 |
| 2016/0322295 A1* | 11/2016 | Kobayashi | ........ | H01L 23/49838 |
| 2016/0358889 A1* | 12/2016 | Lai | ......................... | H01L 23/481 |
| 2017/0020000 A1* | 1/2017 | Yamakami | .......... | H01L 23/5389 |
| 2017/0033083 A1* | 2/2017 | Lin | ................... | H01L 23/49838 |
| 2017/0040266 A1* | 2/2017 | Lin | ..................... | H01L 23/5383 |

* cited by examiner

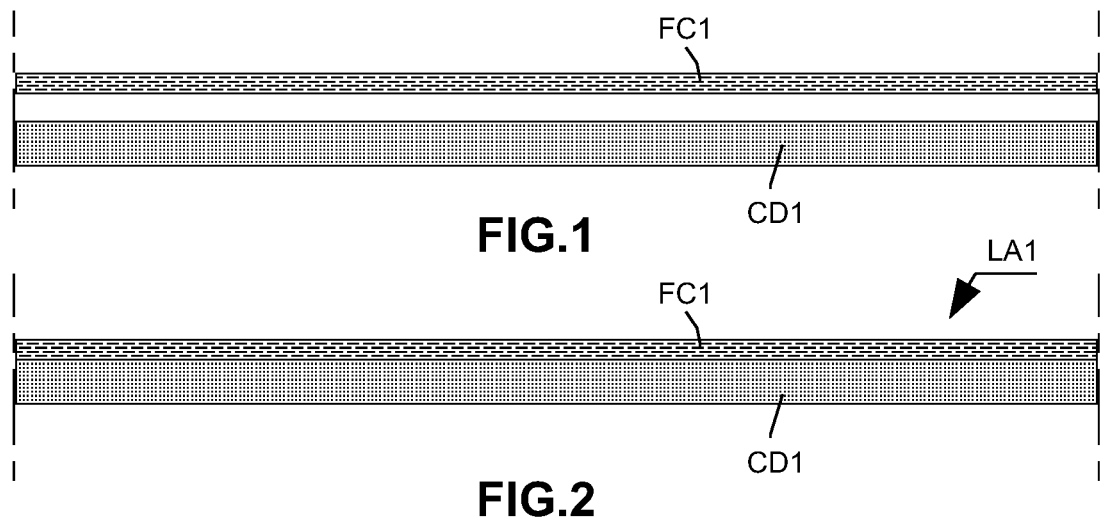
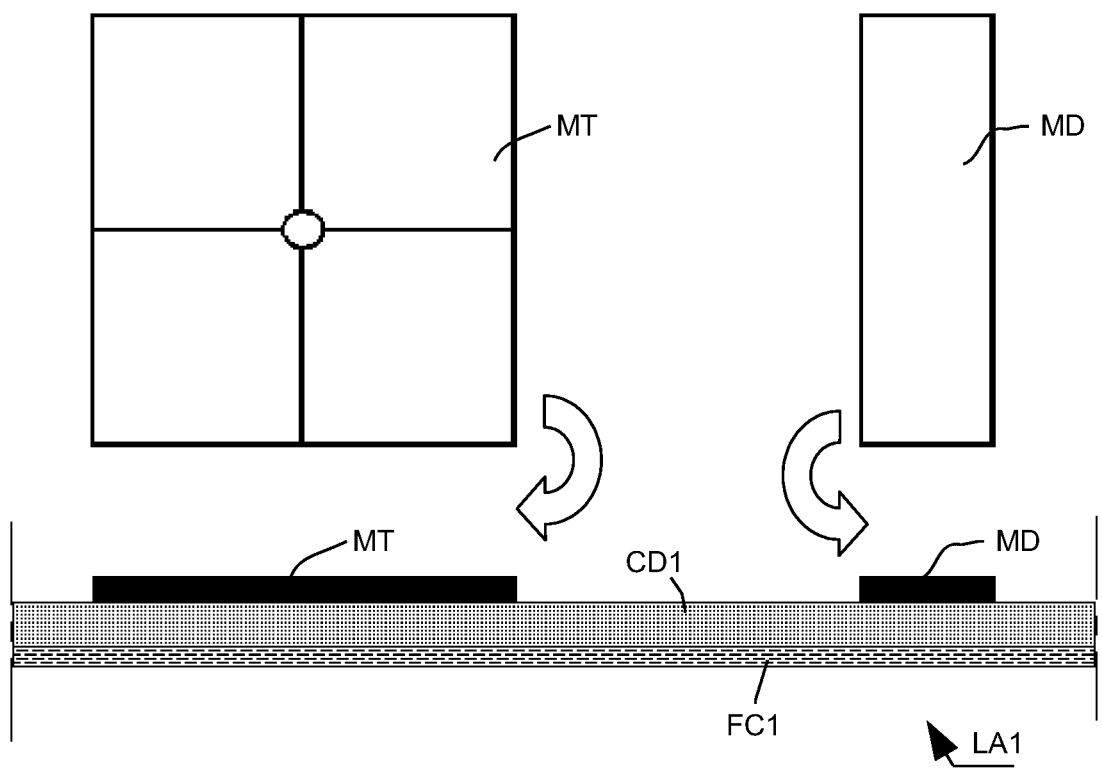

METHOD FOR THE INTEGRATION OF POWER CHIPS AND BUS-BARS FORMING HEAT SINKS

CROSS-REFERENCE TO RELATED APPLICATIONS

This application is the US National Stage under 35 USC § 371 of International Application No. PCT/FR2017/053408, filed Dec. 6, 2017 which claims priority to French application 1662804 filed on Dec. 19, 2016, the content of which (text, drawings, and claims) is incorporated herein by reference.

BACKGROUND

The invention generally relates to the field of power electronics. More particularly, the invention relates to a method for integrating electronic power chips and interconnecting bus-bars forming heat sinks and electronic power devices such as converters and power modules. The invention also relates to electronic power devices obtained by implementing the aforementioned method.

Electronic power devices, such as power converters, are present in many fields such as transportation, industry, lighting, heating, etc. With the desired energy transition toward renewable energy sources producing minimal CO2 emissions, power electronics are called upon to be still further generalized and will have to satisfy increasing economic and technological constraints.

Current research and development is focused on reducing costs, increasing power density, increasing reliability, reducing stray elements, and the heat transfer of the dissipated energy.

In the current state of the art, it is typical to use so-called HDI (High Density Interconnect) technology in order to increase the level of integration and reduce the size of power circuits. The HDI technology generally implemented on printed circuit boards (PCB) is based on optimizing the spatial implantation of components in particular by using tapes and ceramic plates bearing a circuit of copper lines, called "lead frames," to interconnect surface-mounted components or, in a more advanced technology, "microvias" filled with copper to interconnect embedded components. Laser drilling is used as well as different welding techniques, for example brazing, transitional liquid phase (TLP) welding, or metal nanoparticle powder sintering.

HDI technology, however, encounters its limitations when faced with the cost reductions that are necessary for mass production, and the increased level of integration and compactness. The level of integration that can be obtained is limited by the space occupied by the interconnections with tapes and microvias. The interconnections with tapes or cables introduce stray inductances that oppose one another at higher cutoff or switching frequencies. Yet the increase in switching frequencies is generally favorable to compactness, in particular, in power converters. Reducing stray inductances is also necessary to reduce the generated heat, protect the circuits from potentially destructive overvoltages, and improve the mastery of electromagnetic radiation.

High-performing cooling is necessary to keep the temperatures of the active and passive components below critical values, achieve thermal equilibrium, and to guarantee the reliability of the power circuits. The availability of silicon chips with increasingly smaller surfaces and the new power semiconductors, such as silicon carbide, allow higher current densities and an increased cutoff frequency, which allows an even greater compactness of the power circuits. But to that end, the architecture of the power circuits and the technology used must allow the dissipated energy to be extracted as close as possible to the components. It is necessary to optimize the thermal path between the heat sources made up of the components and the heat sinks formed by the heat dissipating means.

In the known technologies, the heat must pass through different layers such as weld, the copper-plated dielectric substrate, the metal base plate, the thermal interface material, and the mass of the heat dissipater, before being transferred into the air or into a cooling liquid.

Today, it appears necessary to offer a new technology for manufacturing electronic power devices having greater heat dissipating performance levels and allowing better optimization relative to the various constraints that apply.

BRIEF SUMMARY

According to a first aspect, a method is disclosed for integrating electronic power chips and bus-bars forming heat sinks for producing an electronic power circuit. The method comprises:
  producing a preform integrating at least one electronic chip comprised between insulating and/or conductive laminated internal layers;
  mechanically securing metal bus-bar segments at given spaced-apart positions on opposing upper and lower faces of the preform, using dielectric portions of resin prepreg; and
  for each of the upper and lower opposing faces, electrodepositing a metal layer in order to interconnect bus-bar segments secured to the face in question and an electrode of the electronic chip, thereby forming the electronic power circuit comprising bus-bars forming heat sinks.

According to one particular feature of the method, the production of the preform includes a step of laminating two laminates having prepreg dielectric layers of resin comprising the electronic chip between them, and outer faces of the laminates being formed from a metal sheet.

According to another particular feature, the production of the preform includes a step of removing material by machining to produce at least one cavity in the preform and to free at least one contact face of the electronic chip.

According to still another particular feature, the production of the preform includes a step of electrodepositing a conforming layer of metal.

According to another particular feature, the production of the preform includes a step of electrodepositing metal filler.

According to another particular step, the production of the preform includes a step of precisely defining connecting patterns by photolithography and wet etching.

According to another aspect, an electronic power circuit obtained by implementing the method as described briefly above, the metal used for the different manufacturing steps of the method being copper.

According to still another aspect, an electronic power device is disclosed comprising at least two circuits as mentioned above, a first so-called upper circuit being stacked on a second so-called lower circuit, the upper and lower circuits being mechanically and electrically connected by their respective bus-bars, at least one central cooling liquid circulation space being located between the upper and lower circuits, and the central cooling liquid circulation space being formed between segments of the bus-bars.

According to one particular feature, the device also comprises at least one upper cooling liquid circulation space that is located in an upper part of the device, and the upper cooling liquid circulation space being formed between segments of an upper bus-bar of the upper circuit and an upper dielectric layer.

According to another particular feature, the device also comprises at least one lower cooling liquid circulation space that is located in a lower part of the device, and the lower cooling liquid circulation space being formed between segments of a lower bus-bar of the lower circuit and a lower dielectric layer.

DESCRIPTION OF THE FIGURES

Other features and advantages of the present invention will appear more clearly upon reading the detailed description below of several specific embodiments, in reference to the appended drawings, in which:

FIGS. 1 to 13 are simplified sectional views showing steps of the method for integrating electronic power chips and bus-bars forming heat sinks.

DETAILED DESCRIPTION

One specific embodiment of the method is now described below in the context of the production of a device or an electronic power module in the form of a transistor switch bridge, or half-bridge, arm. Conventionally, the bridge arm comprises an upper transistor and a lower transistor, respectively called "low side" and "high side," and associated diodes. Such devices can be associated to form complete switching bridges or associated in parallel to pass the desired current.

In general, known and well-mastered printed circuit manufacturing techniques are used for the integration of the electronic chips. Thus, in the method, a combination of different manufacturing techniques can be used including lamination, photolithography, metal electrodeposition, and wet etching. Metal electrodeposition will in particular be used for the interconnection of the electronic chips and bus-bars.

In reference to FIGS. 1 to 13, different manufacturing steps involved in the method for integrating electronic power chips and interconnecting bus-bars according to the invention will now be described.

FIGS. 1 and 2 show an initial step for manufacturing a laminate LA1 made up of a dielectric layer CD1 bearing a conductive metal sheet FC1.

The dielectric layer CD1 is a thick sheet of prepreg typically made up of a dielectric made from woven fiberglass coated with a resin, such as a partially polymerized epoxy resin. The conductive metal sheet FC1 is typically a copper sheet that is laminated on the dielectric layer CD1, as shown in FIG. 2.

In the step of FIG. 3, component chips, for example, in the form of a power transistor MT and a diode MD, are carried over onto the dielectric layer CD1 of the laminate LA1 in predetermined locations. Indexing means, not shown, are used here for the placement of the chips.

Figure 4:
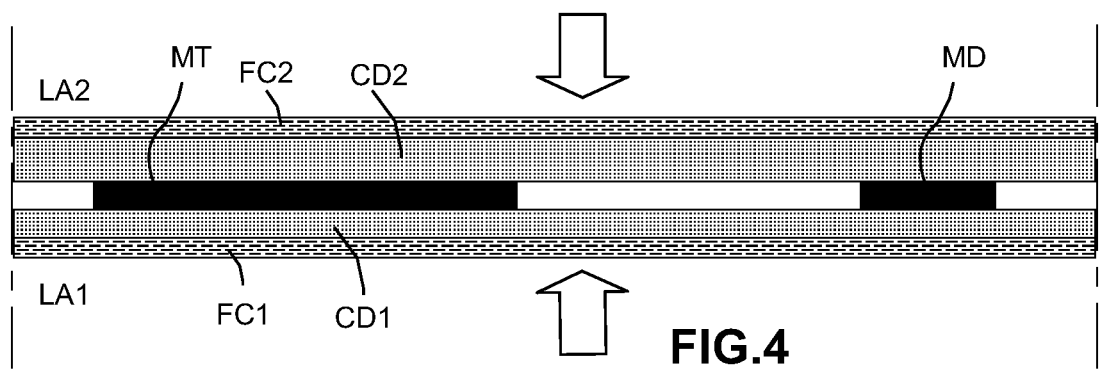

The step of FIG. 4 shows the lamination of the laminate LA1 bearing the chips MT and MD with another laminate LA2 obtained by the steps of FIGS. 1 and 2. At this stage, the dielectric layers CD1 and CD2 are still only partially polymerized. The chips MT and MD are then sandwiched between the laminates LA1 and LA2, more specifically between the dielectric layers CD1 and CD2 of the laminates. Lamination of the laminates LA1 and LA2 relative to one another is typically obtained by pressing and passing in the vacuum lamination furnace.

Figure 5:
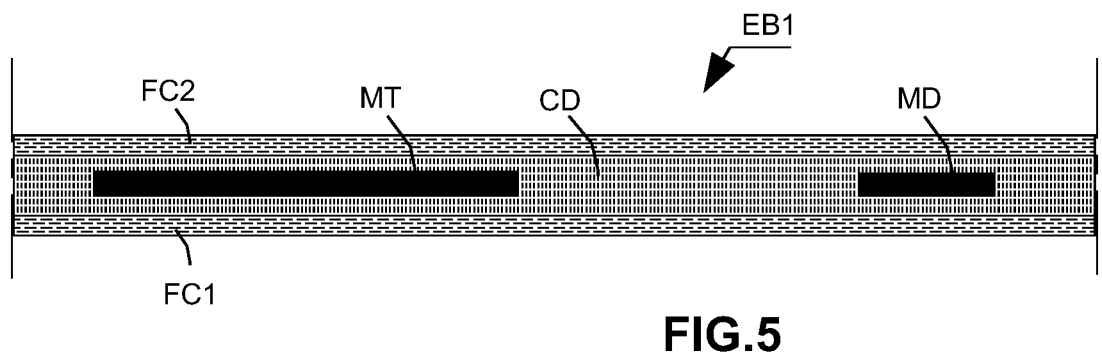

Upon leaving the vacuum lamination furnace, in FIG. 5, a preform EB1 is obtained in which the chips MT and MD are embedded in a dielectric layer CD, completely polymerized and coming from the lamination of the layers CD1 and CD2. The copper sheets FC1 and FC2 make up upper and lower opposing faces of the preform EB1.

Figure 6:
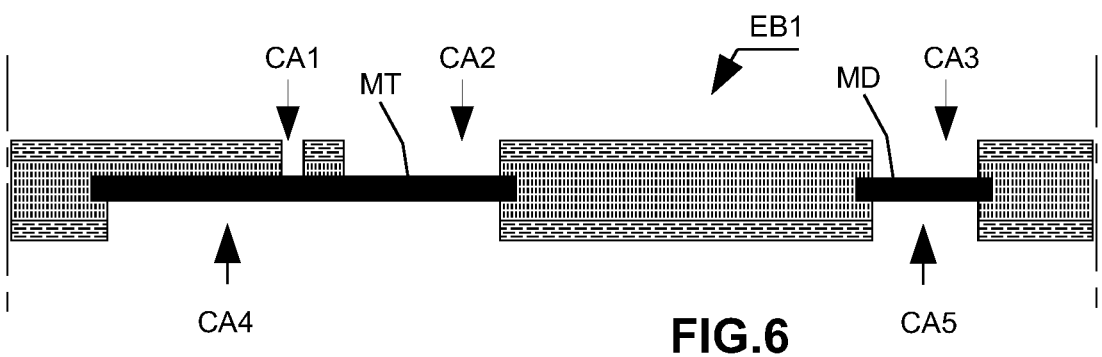

In the step of FIG. 6, material removal operations by machining, for example by laser, are performed on the upper and lower faces of the preform EB1, and cavities CA1 to CA5 are made on both sides of the preform in order to free contact faces of the chips MT and MD.

Figure 7:
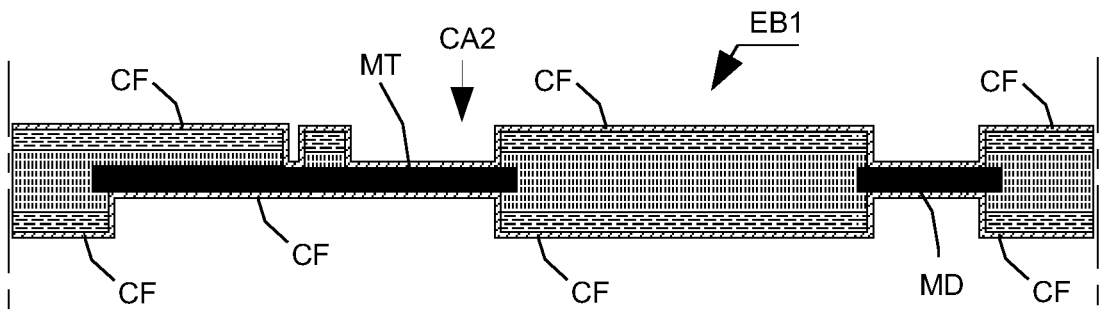

In the step of FIG. 7, a conformal metal layer CF is formed on the machined upper and lower faces of the preform EB1. The layer CF is typically a layer of copper made by electrodeposition.

Figure 8:
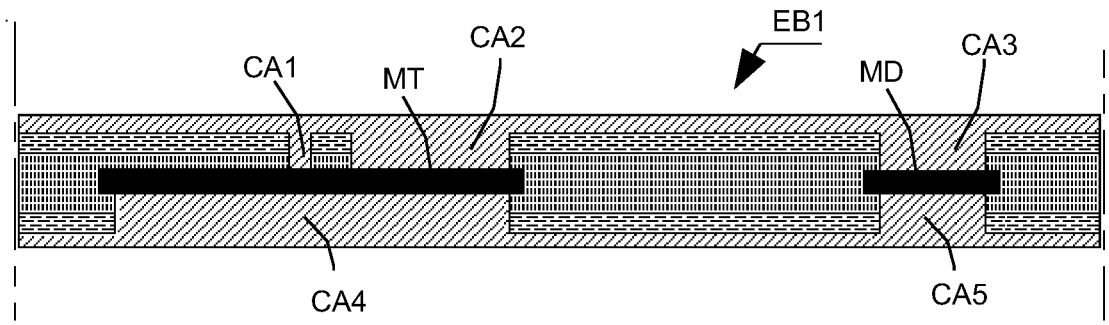

In the step of FIG. 8, a filler electrodeposition is done to completely fill the cavities CA1 to CA5 and all of the opposing upper and lower faces of the preform EB1 with copper. The upper and lower faces of the preform EB1 are then completely flat and covered with copper.

Figure 9:
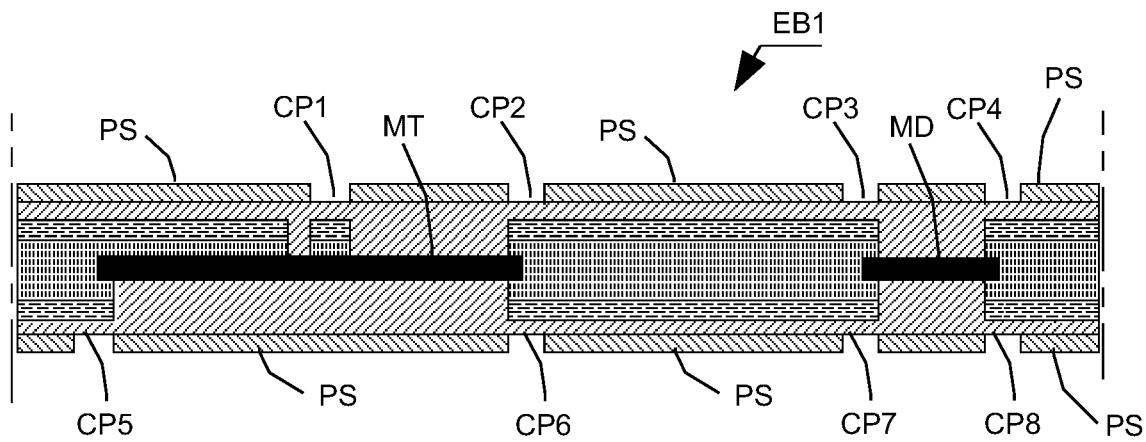
Figure 10:
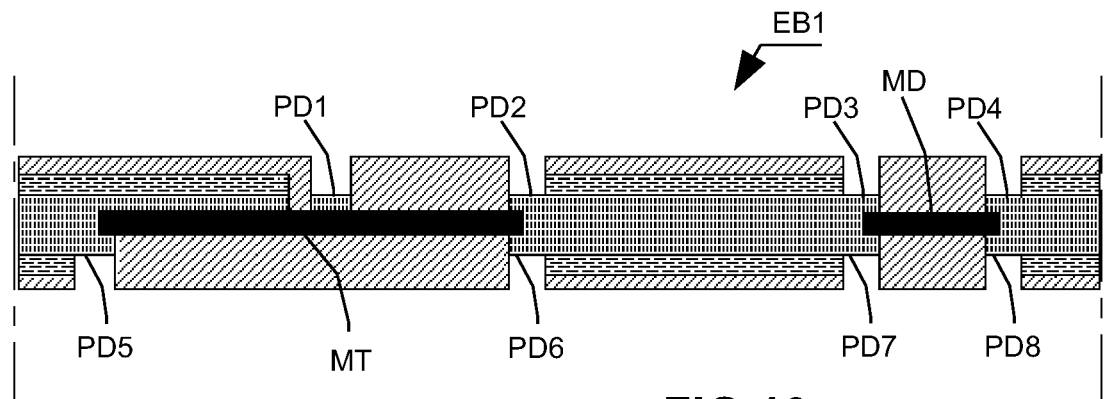

The steps of FIGS. 9 and 10 relate to the exact definition of the electrical connection patterns of the chips MT and MD.

In the step of FIG. 9, a photoresist resin PS has been coated on the upper and lower faces of the preform EB1 and the surface parts to be etched by wet etching have next been defined and freed conventionally by using a screen printing mask and exposure to ultraviolet radiation. FIG. 9 shows the preform EB1 ready for wet etching of the copper and portions of copper CP1 to CP8 to be removed.

In the step of FIG. 10, the copper portions CP1 to CP8 have been removed by wet etching and the connection pattern is then defined precisely. The removal of the copper portions CP1 to CP8 from the cavities PD1 to PD8 allow portions of the underlying dielectric layer CD to appear.

Figure 11:
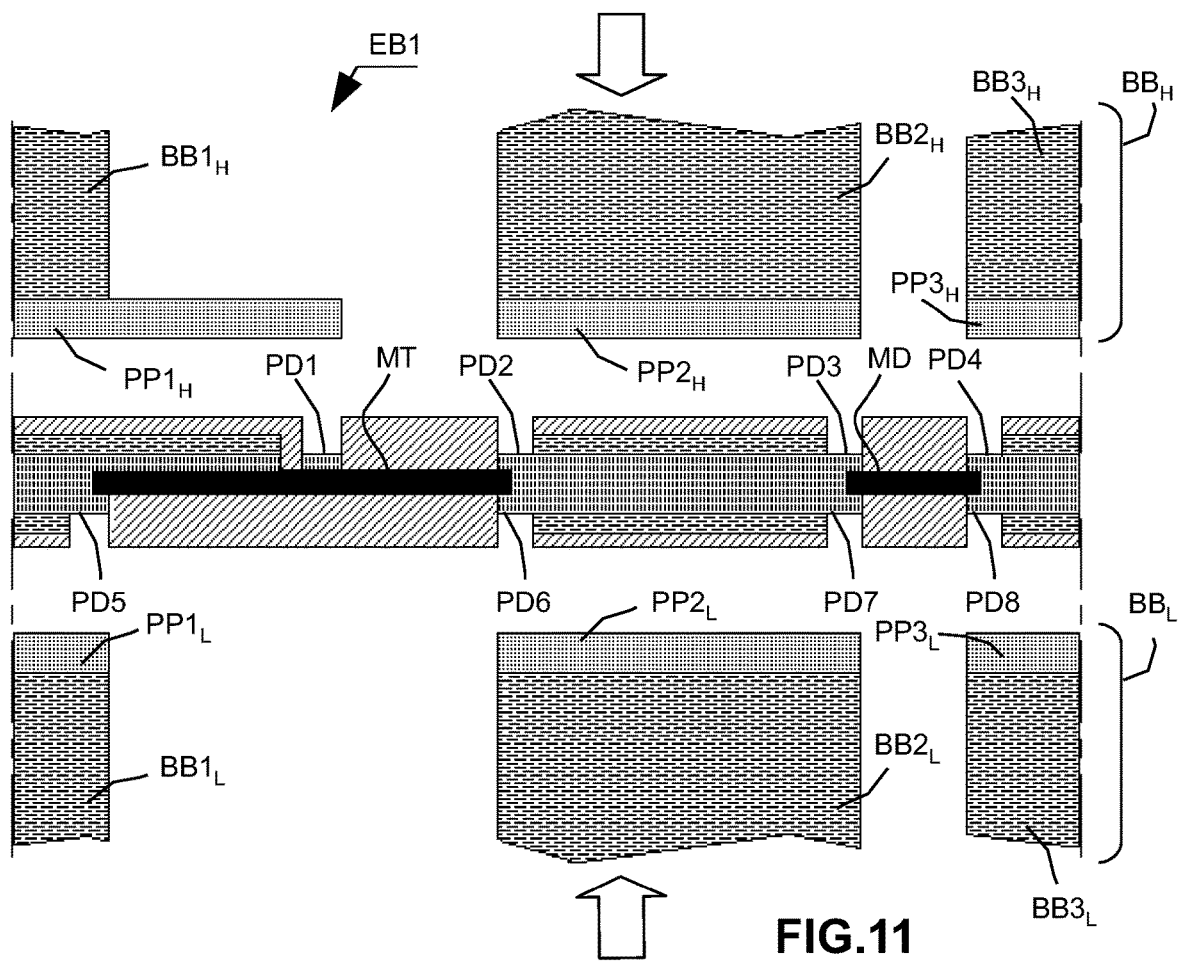
Figure 12:
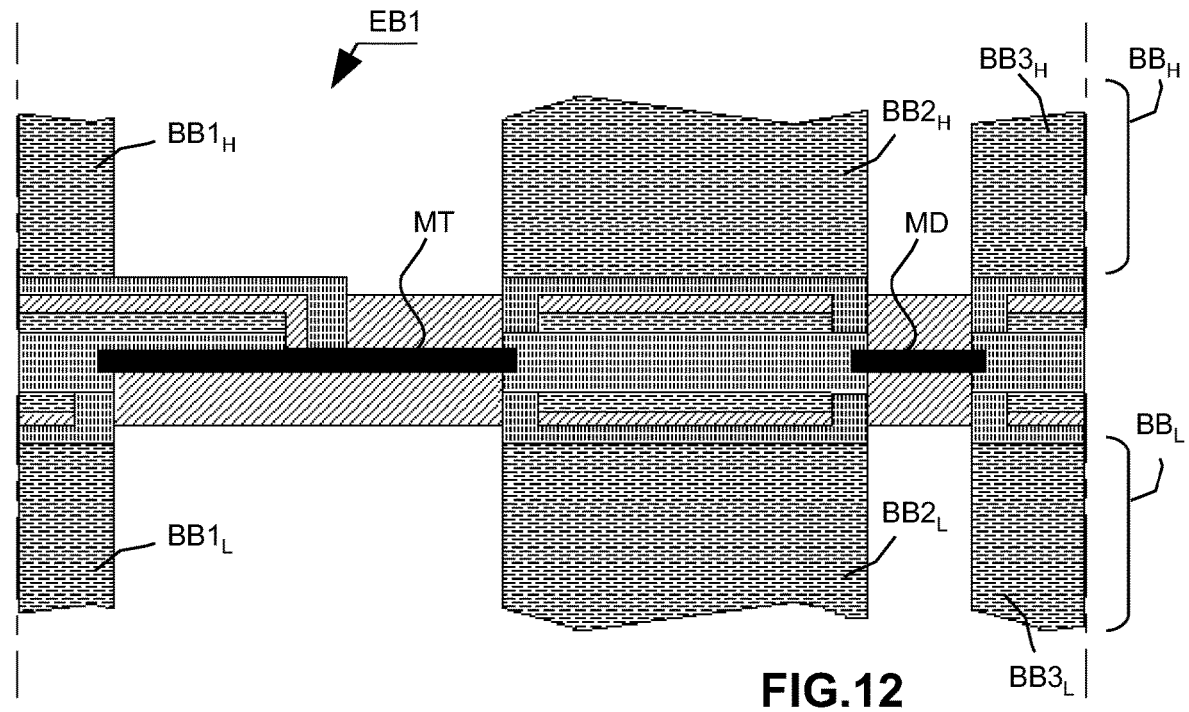
Figure 13:
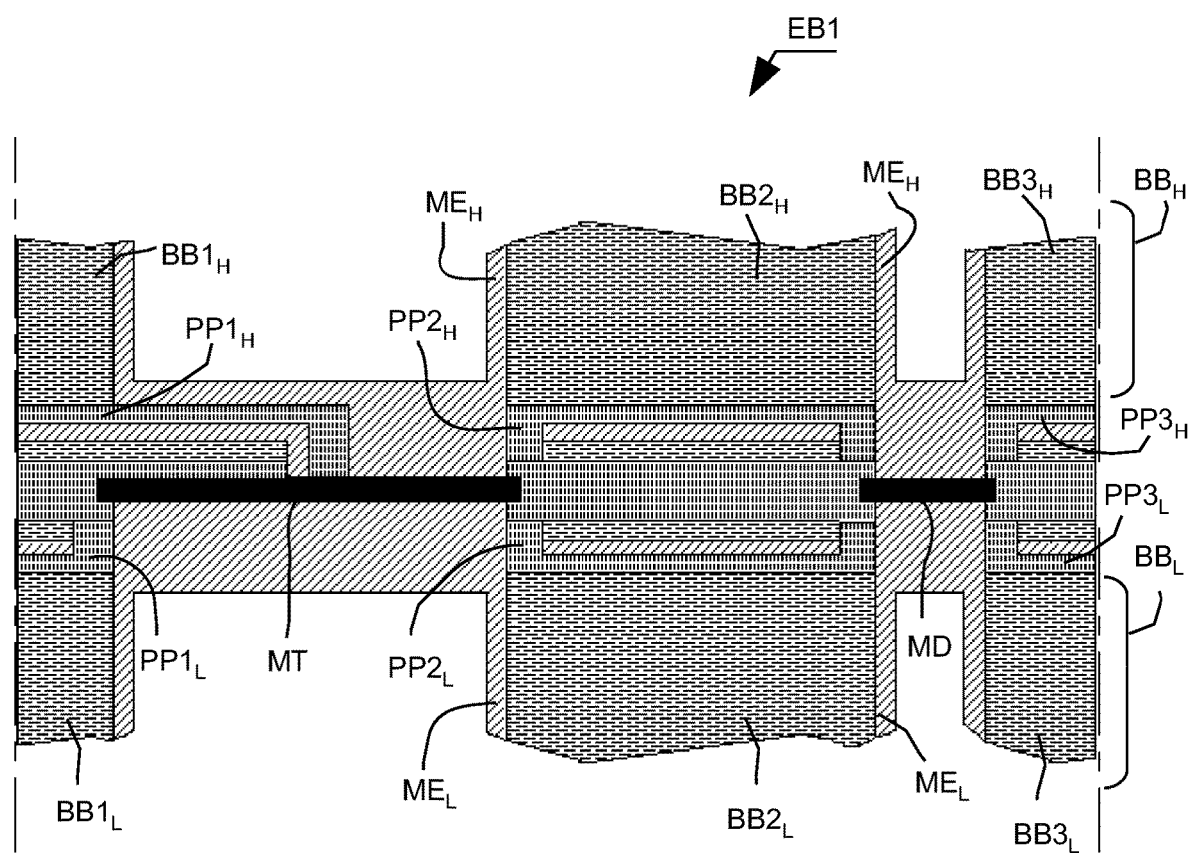

FIGS. 11 to 13 show the interconnection of upper $BB_H$ and lower $BB_L$ bus-bars on the opposing upper and lower faces of the preform EB1. Aside from their typical electrical functions of supplying electricity or the like, the upper $BB_H$ and lower $BB_L$ bus-bars are intended here to form heat sinks implanted on the opposing upper and lower faces of the preform $EB_1$. The bus-bars $BB_H$, $BB_L$ are typically made from copper.

As shown in FIG. 11, the upper $BB_H$ and lower $BB_L$ bus-bars are each formed by several bus segments $BB1_H$, $BB2_H$, $BB3_H$ and $BB1_L$, $BB2_L$, $BB3_L$ that have previously been cut, for example, by mechanical machining, or optionally obtained by molding.

Prepreg dielectric portions $PP1_H$, $PP2_H$, $PP3_H$ are attached on corresponding faces of the bus segments $BB1_H$, $BB2_H$, $BB3_H$ intended to be pressed on the upper face of the preform EB1. Prepreg dielectric portions $PP1_L$, $PP2_L$, $PP3_L$ are attached on corresponding faces of the bus segments $BB1_L$, $BB2_L$, $BB3_L$ intended to be pressed on the lower face of the preform EB1. The prepreg dielectric portions $PP1_H$, $PP2_H$, $PP3_H$ and $PP1_L$, $PP2_L$, $PP3_L$ are provided to fill the upper and lower cavities of the preform EB1 and adhere to the visible portions PD1 to PD4 and PD5 to PD8 of the underlying dielectric layer CD.

The preform EB1 is thus sandwiched between the bus segments $BB1_H$, $BB2_H$, $BB3_H$ and $BB1_L$, $BB2_L$, $BB3_L$. The bus segments $BB1_H$, $BB2_H$, $BB3_H$ and $BB1_L$, $BB2_L$, $BB3_L$ are pressed, with the prepreg dielectric portions $PP1_H$, $PP2_H$, $PP3_H$ and $PP1_L$, $PP2_L$, $PP3_L$, against the upper and lower faces of the preform EB1.

The lamination of the assembly is obtained by passing through a vacuum lamination furnace. FIG. 12 shows the state of the preform EB1 with the bus segments assembled, when the latter is removed from the vacuum lamination furnace. At this stage, the bus segments have been mechanically fastened to the circuit by the complete polymerization of the dielectric portions. The insulating dielectric patterns of the circuit are finalized at this stage.

The step of FIG. 13 is a metallization and welding step that makes it possible to finalize the interconnection of the conductive elements of the circuit and the bus-bars forming heat sinks of the preform EB1.

As shown in FIG. 13, copper layers $ME_H$ and $ME_L$ are electrodeposited on the upper and lower parts of the preform EB1.

The layer of copper $ME_H$ is deposited on the upper part of the preform EB1 and interconnects the bus segments $BB1_H$, $BB2_H$, $BB3_H$ of the bus-bar $BB_H$ and upper faces of the corresponding transistor MT and diode MD chips, for example, to drain and cathode electrodes. The layer of copper $MEL_L$ is deposited on the lower part of the preform EB1 and interconnects the bus segments $BB1_L$, $BB2_L$, $BB3_L$ of the bus-bar $BB_L$ and lower faces of the corresponding transistor MT and diode MD chips to source and anode electrodes.

The method, as described above in reference to FIGS. 1 to 13, allows the manufacture of basic circuit components that can be assembled to form electronic power devices of greater or lesser complexity, with a sandwich architecture. The assembly of basic components is typically done in a press and passing through a furnace. The mechanical and electrical connections between the two components are done by welding. It will be noted that parallelization of the manufacturing is possible by producing the basic circuit components on several production lines.

The architecture of the basic circuit components allows direct copper contact between the heat sinks, formed by bus-bars, and the electrodes of the electronic chips. The heat sinks made up of masses of copper located on either side of the electronic chips and in direct contact therewith allows an effective extraction of heat. Furthermore, the lengths of the connection conductors are minimized, which favors the production of stray inductances and promotes greater compactness.

Figure 14:
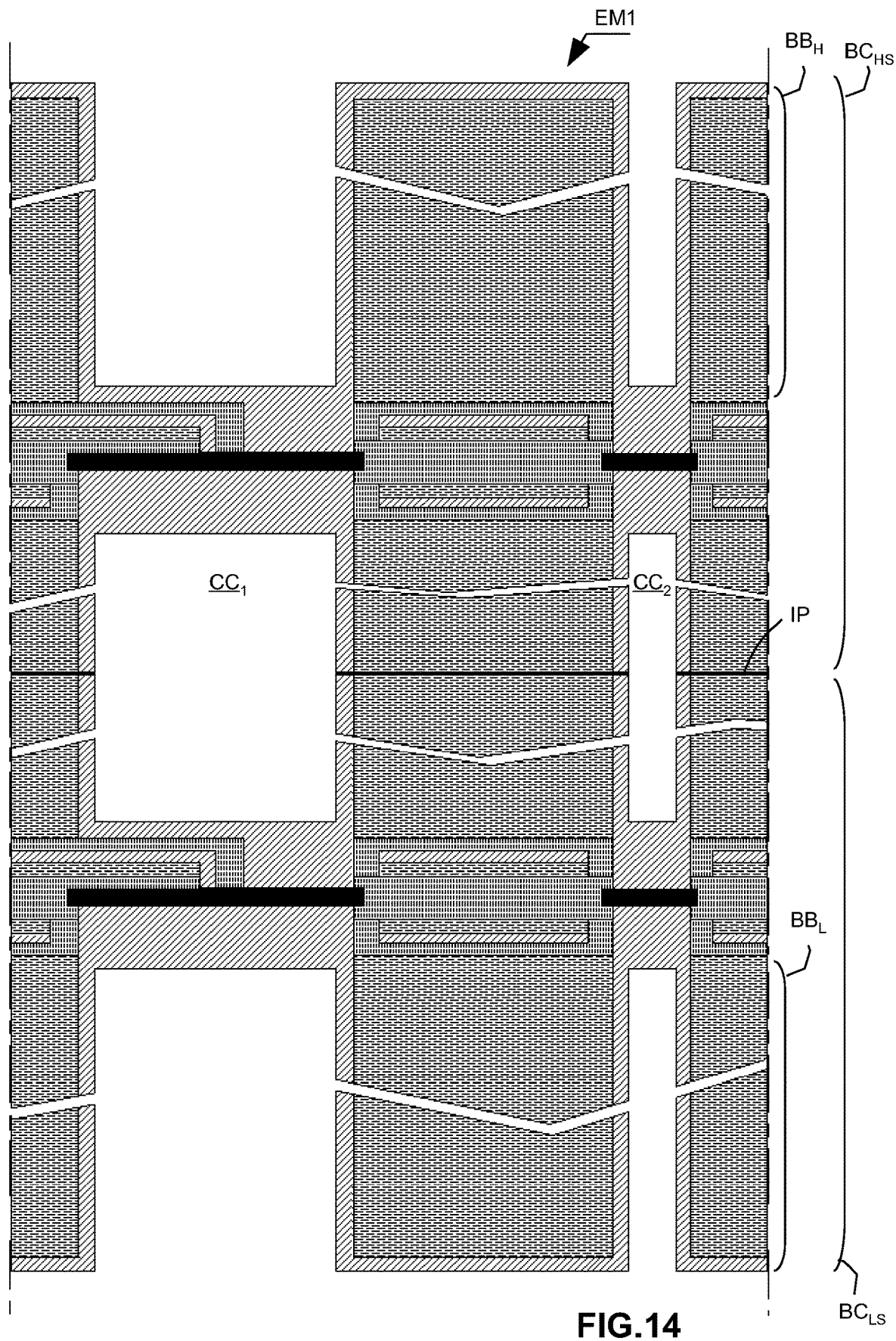
FIGS. 14 and 15 are simplified sectional views showing first and second embodiments of an electronic power device, with heat dissipation by air and by cooling liquid.

FIG. 14 shows a first embodiment EM1 of an electronic power device that is built by stacking two basic circuit components $BC_{HS}$ and $BC_{LS}$. The device EM1 here is a transistor bridge arm made up of two MOSFET transistors and two freewheeling diodes.

The mechanical and electrical connection of two stacked basic components $BC_{HS}$ and $BC_{LS}$ is done at a junction plane IP by assembly of the bus-bars. The assembly can be done, for example, by transitional liquid phase (TLP) welding or other welding techniques.

The device EM1 here is an embodiment with mixed cooling, by liquid cooling and by air.

As shown in FIG. 14, the assembly of the basic components $BB_{HS}$ and $BB_{LS}$ creates central cooling liquid circulation spaces, here $CC_1$ and $CC_2$, in the central part of the device. These cooling liquid circulation spaces $CC_1$ and $CC_2$, which are located as close as possible to the electronic chips, are provided for the pressurized circulation of a heat transfer liquid. In the upper and lower parts of the device EM1, slot profiles of the bus-bars $BB_H$ and $BB_L$, forming heat sinks, increase the heat exchange surfaces with the surrounding air and promote the cooling of the device.

Figure 15:
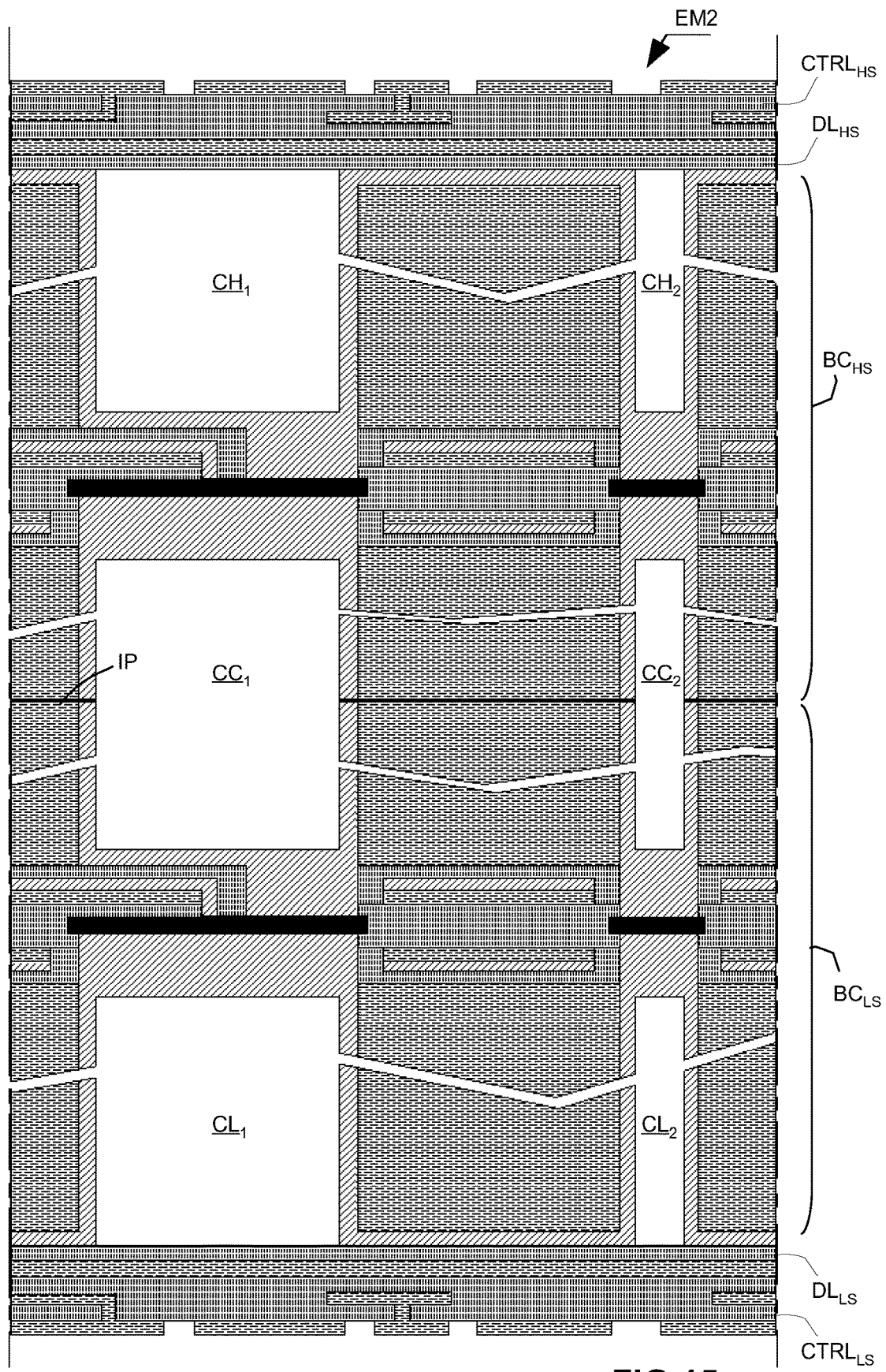

FIG. 15 shows a second embodiment EM2 of an electronic power device. The device EM2 is provided with complete liquid cooling and is suitable for higher power applications than those of the device EM1.

The device EM2 differs from the device EM1 in that it is equipped with control circuits $CTRL_{HS}$ and $CTRL_{LS}$ that are integrated into the upper and lower parts of the device EM2, respectively. The control circuits $CTRL_{HS}$ and $CTRL_{LS}$ are mechanically fastened to and electrically insulated from the upper and lower parts of the basic components $BC_{HS}$ and $BC_{LS}$ by dielectric layers $DL_{HS}$ and $DL_{LS}$, respectively. The circuits $CTRL_{HS}$ and $CTRL_{LS}$ each include several laminated layers, made using known techniques. Active and passive components may, if necessary, be embedded between the internal layers of the circuits $CTRL_{HS}$ and $CTRL_{LS}$, or implanted on the surface on the circuit conventionally by brazing or conductive glue.

As shown in FIG. 15, the integration of control circuits $CTRL_{HS}$ and $CTRL_{LS}$ in the upper and lower part of the device EM2 with the insulating dielectric layers $DL_{HS}$ and $DL_{LS}$ allows the formation of additional upper and lower cooling liquid circulation spaces $CH_1$, $CH_2$ and $CL_1$, $CL_2$. These additional spaces $CH_1$, $CH_2$ and $CL_1$, $CL_2$, located on either side of the central spaces $CC_1$ and $CC_2$, allow increased cooling of the device EM2. The electronic chips are thus cooled more effectively by the circulation of a heat transfer fluid near their upper and lower faces.

Other embodiments of electronic power devices according to the invention are of course possible. Thus, for example, the upper part and/or the lower part of the device may be closed simply with a dielectric layer, without implanting a control circuit in this location.

The claimed invention is not limited to the specific embodiments that have been described here as an example. Depending on the applications of the claimed invention, one skilled in the art may make various changes and supply variants that fall within the scope of the appended claims.

The invention claimed is:

1. A method for integrating electronic power chips and bus-bars forming heat sinks for producing an electronic power circuit, characterized in that the method comprises:
   producing a preform comprising at least one electronic chip between insulating and/or conductive laminated internal layers;
   mechanically securing metal bus-bar segments at given spaced-apart positions on opposing upper and lower faces of said preform, using dielectric portions of a resin prepreg; and
   for each of said upper and lower opposing faces, electrodepositing a metal layer in order to interconnect bus-bar segments and an electrode of said electronic chip, thereby forming the electronic power circuit comprising bus-bars forming heat sinks.

2. The method according to claim 1, wherein said production of the preform includes a step of laminating two laminates having prepreg dielectric layers of resin with the electronic chip between them, and outer faces of said laminates being formed from a metal sheet.

3. The method according to claim 1, wherein said production of the preform includes a step of removing material by machining to produce at least one cavity in the preform and to free at least one contact face of the electronic chip.

4. The method according to claim 1, wherein said production of the preform includes a step of electrodepositing a conforming layer of metal.

5. The method according to claim 1, wherein said production of the preform includes a step of electrodepositing metal filler.

6. The method according to claim 1, wherein said production of the preform includes a step of precisely defining connecting patterns by photolithography and wet etching.

7. An electronic power circuit, it wherein said electronic power circuit is obtained by implementing the method according claim 1, the metal used for the different manufacturing steps of the method being copper.

8. An electronic power device, wherein said electronic power device comprises at least two circuits according to claim 7, a first upper circuit stacked on a second lower circuit, said upper and lower circuits being mechanically and electrically connected by their respective bus-bars and said electronic power device comprising at least one central cooling liquid circulation space located between said upper and lower circuits, said central cooling liquid circulation space being formed between segments of the bus-bars.

9. The electronic power device according to claim 8, it wherein said electronic power device also comprises at least one upper cooling liquid circulation space that is located in an upper part of the device, said upper cooling liquid circulation space being formed between segments of an upper bus-bar of said upper circuit and an upper dielectric layer.

10. The electronic power device according to claim 8, wherein said electronic power device also comprises at least one lower cooling liquid circulation space that is located in a lower part of the device, said lower cooling liquid circulation space being formed between segments of a lower bus-bar of the lower circuit and a lower dielectric layer.

* * * * *